(12) United States Patent
Okumura et al.

(10) Patent No.: US 7,626,364 B2
(45) Date of Patent: Dec. 1, 2009

(54) SECONDARY BATTERY REPLACEMENT METHOD

(75) Inventors: Motoyoshi Okumura, Chiryu (JP); Yasuhiro Takahashi, Nishikamo-gun (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 64 days.

(21) Appl. No.: 10/536,265

(22) PCT Filed: Dec. 1, 2003

(86) PCT No.: PCT/IB03/05535

§ 371 (c)(1), (2), (4) Date: May 25, 2005

(87) PCT Pub. No.: WO2004/051296

PCT Pub. Date: Jun. 17, 2004

(65) Prior Publication Data

US 2006/0012330 A1 Jan. 19, 2006

(30) Foreign Application Priority Data

Dec. 2, 2002 (JP) .............................. 2002-350173

(51) Int. Cl.
*H01M 10/46* (2006.01)
*H01M 10/44* (2006.01)

(52) U.S. Cl. ............................ 320/137; 320/116; 429/52
(58) Field of Classification Search ................. 327/426; 429/52; 320/116
See application file for complete search history.

(56) References Cited

U.S. PATENT DOCUMENTS

| | | | | |
|---|---|---|---|---|
| 6,072,300 | A | * | 6/2000 | Tsuji ........................... 320/116 |
| 2002/0153864 | A1 | * | 10/2002 | Bertness ...................... 320/132 |
| 2003/0224241 | A1 | * | 12/2003 | Takada et al. .................. 429/52 |

FOREIGN PATENT DOCUMENTS

| | | |
|---|---|---|
| EP | 0 609 101 | 8/1994 |
| EP | 1 150 132 | 10/2001 |
| JP | 11-149944 | 6/1999 |
| JP | 2002-015781 | 1/2002 |

* cited by examiner

*Primary Examiner*—Edward Tso
*Assistant Examiner*—Alexis Boateng
(74) *Attorney, Agent, or Firm*—Kenyon & Kenyon LLP

(57) ABSTRACT

A replacement method is provided for replacing a to-be-replaced battery module with a replacing fresh battery module in a battery assembly formed by electrically connecting a plurality of battery modules in series or parallel. The method includes the step (S110) of charging the fresh battery module so that the quantity of charged electricity of the fresh battery module is 5 to 20% less than the quantity of charged electricity of a battery module other than the to-be-replaced battery module, and the step (S120) of replacing the to-be-replaced battery module with the charged fresh battery module.

7 Claims, 6 Drawing Sheets

FIG. 5

NORMAL REACTIONS

| | ⟨DISCHARGE SIDE⟩ | | ⟨CHARGE SIDE⟩ | |
|---|---|---|---|---|
| POSITIVE ELECTRODE: | $Ni(OH)_2 + OH^-$ | $\rightleftarrows$ | $NiOOH + H_2O + e^-$ | (1) |
| NEGATIVE ELECTRODE: | $M + H_2O + e^-$ (HYDROGEN-STORING ALLOY) | $\rightleftarrows$ | $MH + OH^-$ | (2) |

$$\text{CHRGE} \rightleftarrows \text{DISCHARGE}$$

| OVERALL REACTION: | $Ni(OH)_2 + M$ | | $NiOOH + MH$ | (3) |

OVERCHARGE

| POSITIVE ELECTRODE: | $OH^-$ | $\rightarrow$ | $1/2\ H_2O + 1/4\ O_2\uparrow + e^-$ | (4) |
|---|---|---|---|---|
| NEGATIVE ELECTRODE: | $M + H_2O + e^-$ (HYDROGEN-STORING ALLOY) | $\rightarrow$ | $MH + OH^-$ | (5) |
| | $MH_x$ | $\rightarrow$ | $M + x/2\ H_2\uparrow$ | (6) |

RECOMBINATION REACTIONS

| $MH_x + O_2 \rightarrow MH_{x-4} + 2H_2O$ | (OXYGEN GAS REDUCED BY HYDROGEN IN M(HYDROGEN-STORING ALLOY)) | (7) |
|---|---|---|
| $MH_x + H_2 \rightarrow MH_{x+2}$ | (HYDROGEN DIRECTLY STORED BY M(HYDROGEN-STORING ALLOY) DUE TO ITS WATER REPELLENCY) | (8) |

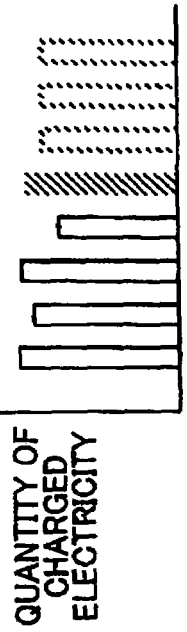
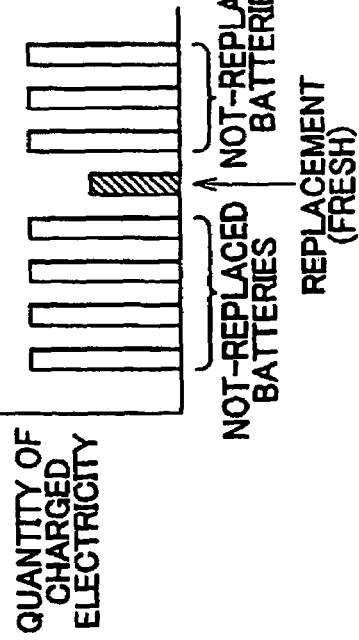

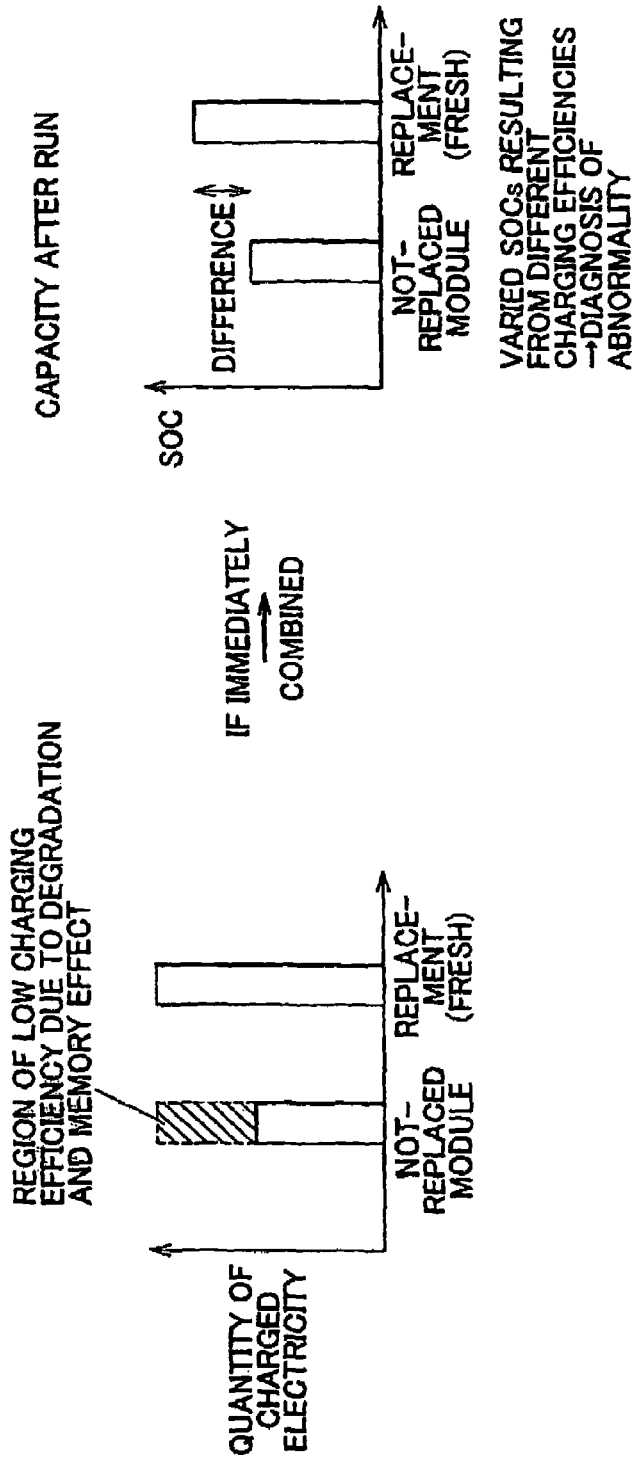

SECONDARY BATTERY REPLACEMENT METHOD

The is a 371 national phase application of PCT/IB2003/005535 filed 1 Dec. 2003, claiming priority to Japanese Application No. 2002-350173 filed 2 Dec. 2002, the contents of which are incorporated herein by reference.

BACKGROUND OF THE INVENTION

1. Field of the Invention

The invention relates to a secondary battery replacement method for replacing one or more secondary batteries in a battery assembly formed by electrically connecting a plurality of secondary batteries in series or parallel if the one or more secondary batteries have degradation (including reduction in the fully charged capacity, acquisition of memory effect, etc.), or if the one or more batteries reach the end of service life or have a failure. More particularly, the invention relates to a method for replacing secondary batteries installed in pure electric vehicles (PEVs) or hybrid engine vehicles (HEVs).

2. Description of the Related Art

Examples of the secondary battery include lead-acid batteries, nickel-cadmium (Ni—Cd) batteries, nickel-metal hydride (Ni-MH) batteries, lithium ion batteries, etc. Each secondary battery has a characteristic that, when exhausted, the battery can be charged by connecting the battery to an external electric power supply and supplying a predetermined current to the battery. Due to this characteristic, secondary batteries have been used in various appliances. For example, secondary batteries are installed in conventional motor vehicles in order to supply power to ignition plugs of engines.

Recently, in many electric vehicles (PEVs) and many generally-termed hybrid vehicles (HEVs) equipped with an internal combustion engine and an electric motor, Ni-MH batteries are adopted as a main electric power source for driving the electric motor, due to the high energy density (i.e., compact storage of energy) and the high output density of the Ni-MH batteries. For use in PEVs and HEVs, battery assemblies are each formed by combining a plurality of unit cells in series or parallel, and are used as a battery pack, in order to supply sufficient power to the electric motor.

With regard to such a Ni-MH secondary battery installed in PEVs and HEVs in the form of a plurality of battery assemblies connected, a long service life is possible if the service condition is appropriate. In normal cases, however, the battery assemblies individually come to have an abnormality or reach the end of service life one at a time due to individual differences of secondary batteries or defects in component parts of secondary batteries. If in a battery assembly there is a secondary battery that has an abnormality or has reached the end of service life, the battery assembly cannot perform its normal functions, and is very likely to cause a system malfunction. Accordingly, Japanese Patent Application Laid-Open Publication No. 2002-15781 discloses a secondary battery replacement method that allows a battery assembly as a whole to deliver its full performance after replacement of one or more of the secondary batteries of the battery assembly.

The replacement method disclosed in Japanese Patent Application Laid-Open Publication No. 2002-15781 is a method for replacing one or more of the secondary batteries that are electrically connected in series or parallel so as to form a battery assembly with replacement batteries if the one or more secondary batteries are found faulty. The replacement method includes the steps of: detecting the voltage of each one of predetermined voltage detection blocks of the secondary batteries forming the battery assembly; determining whether a voltage detection block has any faulty battery on a block-by-block basis; and replacing the secondary batteries of the voltage detection block that includes the battery that is found faulty by the determining step with replacement batteries.

According to the method disclosed in Japanese Patent Application Laid-Open Publication No. 2002-15781, there is no need to replace the whole battery assembly and no need to identify which one of the secondary batteries is a faulty battery. Instead, secondary batteries, including a faulty battery, are replaced in the unit of a voltage detection block provided for detection and control of battery voltage in an existing construction. Thus, it is made possible to perform this method merely by a change in software, without the need to add a hardware arrangement for detecting a faulty battery. Therefore, the method allows a reduction in the cost of replacement batteries and a reduction in the cost related to detection of a faulty battery. Furthermore, if, in this method, secondary batteries of a highest capacity rank in the group of secondary batteries that form a battery assembly are used as replacement batteries, the capacity of the battery assembly will not be restricted by replacement batteries, so that the performance of the battery assembly can be maintained as high as before the replacement.

Particularly in an application as in HEVs where secondary batteries are not fully charged but are normally used with an intermediate amount of remaining capacity, the following problems may arise; (1) due to varied remaining capacities of the secondary batteries of a battery assembly, the discharge operation of the battery assembly is restricted by a battery that has a small remaining capacity, and the charge operation is restricted by a battery that has a large remaining capacity, so that the capacity of the entire battery assembly cannot be fully utilized; (2) due to varied self-discharge characteristics of the secondary batteries of a battery assembly, the discharge operation of the battery assembly is restricted by a battery of a great self-discharge characteristic, and the charge is restricted by a battery of a small discharge characteristic, so that varied remaining capacities will be caused; and (3) due to varied internal resistances of secondary batteries of a battery assembly, for example, in a case where replacement batteries having great internal resistance are incorporated into the battery assembly, determination of a capacity may produce an error with respect to the actual capacity depending on the method of determination adopted, so that the battery assembly may fail to deliver satisfactory performance.

According to a replacement method disclosed in the Japanese Patent Application Laid-Open Publication No. 2002-15781 with regard to a battery assembly of nickel-metal hydride batteries, a replacement battery module that is higher in capacity rank than any one of the battery modules of the assembly that are not to be replaced, that is, a replacement battery module that will be in the top capacity rank when incorporated into the battery assembly, is selected from battery modules transported and stored at low temperature. The not-replaced secondary batteries have a region of low charging efficiency in a region where the quantity of charged electricity is high (high SOC region) as indicated in FIG. 7A, due to aging degradation or memory effect acquired during use. On the other hand, the replacement battery module is a fresh module having a greater charging capacity than the other battery modules, and provides a normal charging efficiency in a region equivalent to the region of low charging efficiency of the not-replaced battery modules. If a battery assembly formed by a combination of secondary batteries having different charging efficiencies as described above is subjected to repeated charge-discharge cycles without any special process, such as an equalizing process or the like, the different charging efficiencies of the batteries result in varied states of charge (SOC). Therefore, when a battery ECU (electronic control unit) computes the SOC of each battery module, the difference in SOC between the fresh battery and the not-replaced batteries becomes great, so that the battery ECU determines "SOC variation abnormality" as a diagnosis in order to protect the battery as indicated in FIG. 7B. There is another possibility of the fresh battery being overcharged in the high SOC region.

SUMMARY OF THE INVENTION

The invention has been accomplished in order to solve the aforementioned problems. An object of the invention is to provide a secondary battery replacement method that allows maximum performance of a battery assembly as a whole after replacement of a battery module of the battery assembly, while avoiding a false detection of battery abnormality without the need to perform a special process, such as an equalizing process or the like, after the replacement.

In a secondary battery replacement method in accordance with a first aspect of the invention, a to-be-replaced secondary battery in a battery assembly formed by electrically connecting a plurality of secondary batteries in series or parallel is replaced with a replacing fresh secondary battery. The method includes the steps of: charging the fresh secondary battery so that a quantity of charged electricity of the fresh secondary battery is less than a quantity of charged electricity of a secondary battery present in the battery assembly which is other than the to-be-replaced secondary battery; and replacing the to-be-replaced secondary battery with the fresh secondary battery charged in the charging step.

According to the first aspect of the invention, when a secondary battery in a battery assembly made up of a plurality of secondary batteries is to be replaced with a fresh secondary battery, the fresh secondary battery is charged so that the quantity of charged electricity of the fresh secondary battery is less than the quantity of charged electricity of a secondary battery present in the battery assembly which is other than the to-be-replaced secondary battery. For example, if one of the fifteen secondary batteries of a battery assembly installed in an HEV is to be replaced upon a diagnosis of battery abnormality, the fresh secondary battery is charged so that the quantity of charged electricity of the fresh secondary battery is 5 to 20% less than a quantity of charged electricity of the fourteen secondary batteries other than the to-be-replaced battery (e.g., a mean value of the quantities of charged electricity of the 14 batteries). While this state of the fresh secondary battery, that is, the state where the quantity of charged electricity of the fresh secondary battery is not equal to but is slightly less than the quantity of charged electricity regarding the fourteen secondary batteries, is maintained, the fresh secondary battery is incorporated into the battery assembly and is combined with the fourteen secondary batteries. The thus-rebuilt battery assembly is charged and discharged repeatedly corresponding to a secondary battery having a low full-charged capacity. Therefore, the fresh secondary battery is not degraded, and the operating region of the fresh secondary battery gradually shifts to a high SOC region since the fresh secondary battery is free of memory effect. In this invention, since the quantity of charged electricity of a fresh secondary battery before incorporation into the battery assembly is less than the not-replaced secondary batteries of the assembly, the aforementioned shift to the high SOC region relatively delays. The fresh battery, as the time of use increases, gradually degrades and acquires memory effect, so that the operating region thereof shifts to a low SOC region. Thus, the fresh battery comes to have substantially the same capacity as the other batteries merely through charge-discharge cycles. Therefore, according to the invention, it is possible to provide a secondary battery replacement method that allows maximum performance of a battery assembly as a whole after replacement of a secondary battery of the battery assembly with a fresh secondary battery, while avoiding a false detection of battery abnormality or avoiding overcharge of the fresh battery, without the need to perform a special process, such as an equalizing process or the like, after the replacement.

In the first aspect of the invention, the to-be-replaced secondary battery may be a secondary battery having a reduced full-charged capacity or a secondary battery possessing a memory effect. In this case, it is possible to provide a secondary battery replacement method that allows maximum performance of a battery assembly as a whole by replacing a secondary battery having a reduced full-charged capacity or a secondary battery possessing a memory effect.

Furthermore, in the first aspect of the invention, the replacing step may include the step of incorporating the charged fresh secondary battery into a portion of the battery assembly where temperature is high. This incorporating step will accelerate the equalization of performances of the secondary batteries of the battery assembly, since the fresh secondary battery degrades faster due to the effect of temperature.

Still further, in the first aspect of the invention, the charging step may include the step of charging the fresh secondary battery so that the quantity of charged electricity of the fresh secondary battery is 5 to 20% less than the quantity of charged electricity of the secondary battery other than the to-be-replaced secondary battery. This charging step avoids a difference in the quantity of charged electricity which is greater than 20%, and therefore avoids detection of battery abnormality by a battery ECU. The charging step also avoids a difference in the quantity of charged electricity which is less than 5%, and therefore avoids a failure in the equalization.

Yet further, the secondary battery may be a nickel-metal hydride battery.

BRIEF DESCRIPTION OF THE DRAWINGS

FIG. 5 provides a brief description of chemical reactions that occur in a battery.

FIGS. 6A and 6B indicate the states of modules at the time of incorporation of a fresh module and after the incorporation.

FIGS. 7A and 7B illustrate a problem of a conventional replacement method.

DETAILED DESCRIPTION OF PREFERRED EMBODIMENTS

Figure 1:
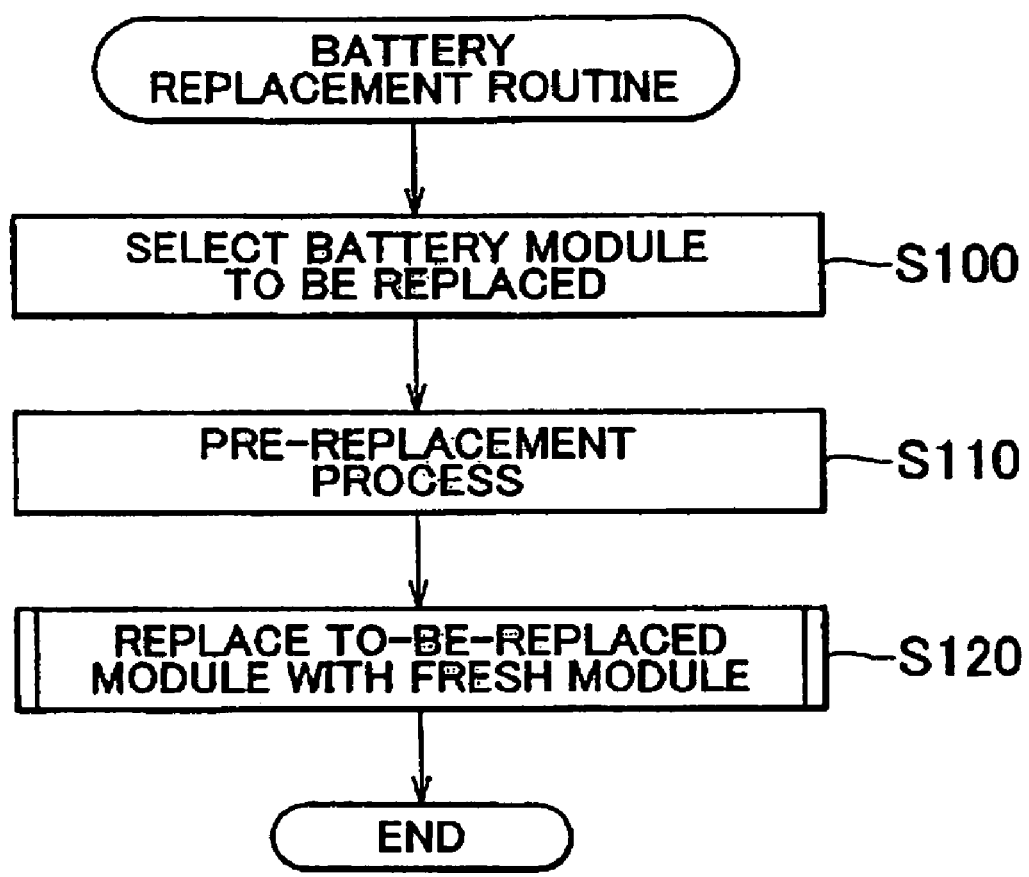
FIG. 1 is a flowchart illustrating a battery replacement process routine in accordance with an embodiment of the invention.

Preferred embodiments of the invention will be described hereinafter with reference to the accompanying drawings. In the description below, like components are presented with like reference characters. Such like components are provided with the same names, and perform the same functions. Detailed description of the like components will not be redundantly given.

The "secondary battery" in the invention refers to a monoblock type battery module formed as a battery assembly by a single unit cell or by internally connecting a plurality of unit cells. The "secondary battery" in the invention is not limited to secondary batteries in a battery assembly which are electrically connected in series or parallel, but also includes secondary batteries in a battery assembly system which are combined in series or parallel.

In conjunction with an embodiment of the invention, a Ni-MH secondary battery, that is, a type of alkali secondary battery, will be described. Presented as an example of the Ni-MH secondary battery in this embodiment is a battery (hereinafter, referred to as "battery module") in which a battery jar assembly is formed by integrally connecting six rectangular parallelepiped-shaped battery jars at their short-side surfaces, and in which an upper surface opening of each battery jar is closed integrally with a lid, and the unit cells adjacent to each other at upper end portions of the adjacent short-side surfaces of the battery jars are internally connected.

It will be assumed that a block is formed by two modules each of which has six battery jars (each battery jar is termed "cell"), and that replacement can be performed on a block-by-block basis. However, the following description will be made on the assumption that replacement can be performed on a module-by-module basis.

Since the rated voltage of each cell is 1.2 V, the rated voltage of a block is 14.4 V. A hybrid engine vehicle (HEV) is equipped with a battery assembly formed by connecting about 15 blocks in series (the rated voltage of the battery assembly is 216 V).

A method for replacing a secondary battery module formed in the above-described manner will be described with reference to FIG. 1.

Referring to FIG. 1, in step (hereinafter, simply referred to as "S") 100, a battery module to be replaced is selected. In this step, the selection of a battery module to be replaced is based on the OCV (open circuit voltage), the SOC, the state of discharge, the value of internal resistance, the full-charged capacity, the state of self-discharge, etc. that are detected on each battery module. For example, a battery module having an increased value of internal resistance or a battery module having a reduced full-charged capacity is selected as a to-be-replaced battery module.

Figure 2:
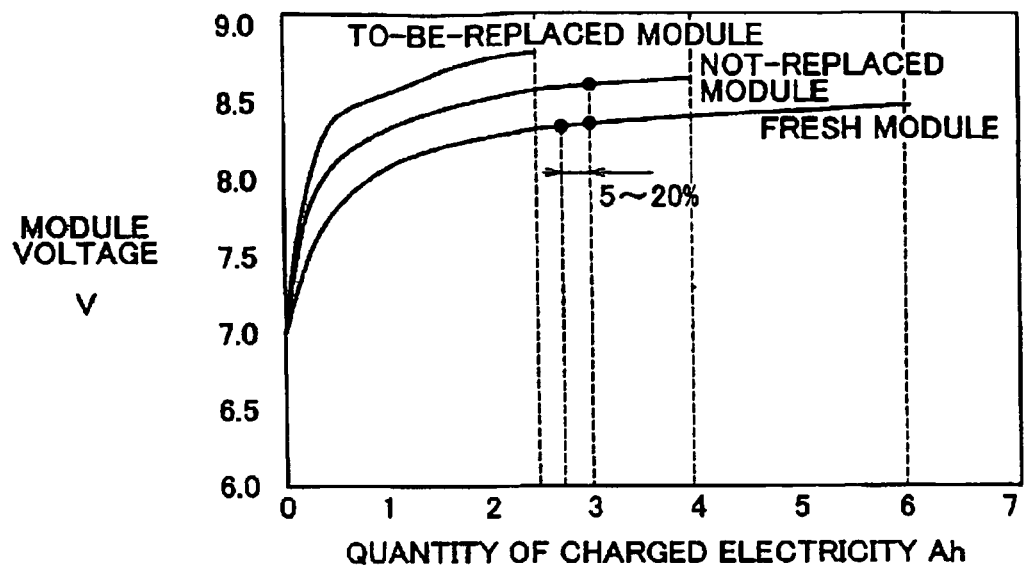
FIG. 2 is a diagram (first diagram) indicating a relationship between the quantity of charged electricity and the module voltage.
Figure 3:
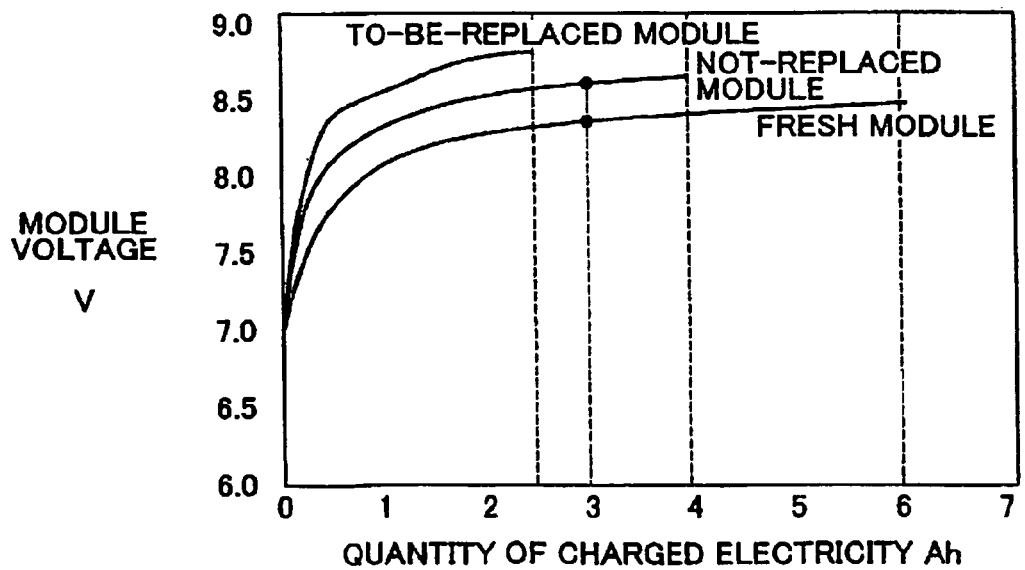
FIG. 3 is a diagram (second diagram) indicating a relationship between the quantity of charged electricity and the module voltage.

In S110, a pre-replacement process is performed on a replacement battery module, that is, a fresh battery module, before the fresh module is incorporated into the battery assembly. In the pre-replacement process, the replacement battery module is charged so that the quantity of charged electricity of the replacement battery module becomes 5 to 20% less than the detected quantity of charged electricity regarding the battery modules that are not replaced, as indicated in FIG. 2. For example, if the quantity of charged electricity of a not-replaced battery module is 3.0 Ah, the replacement battery module is charged up to 2.4 to 2.85 Ah as indicated in FIG. 2. In contrast, in a conventional technology, if the quantity of charged electricity of a not-replaced battery module is 3.0 Ah, the replacement battery module is also charged up to 3.0 Ah as indicated in FIG. 3.

In S120, the to-be-replaced battery module is replaced with the replacement battery module. In this step, the replacement battery module may be incorporated at a location in the battery assembly where temperature becomes highest. The location in the battery assembly where temperature becomes highest is, for example, the location of a battery module disposed in the middle of a plurality of battery modules in the assembly, or the location of a battery module that is unlikely to receive cooling air flow.

An operation of the battery assembly rebuilt by replacing a replacement-object battery module with the replacement battery module in the above-described manner will be described.

Figure 4:
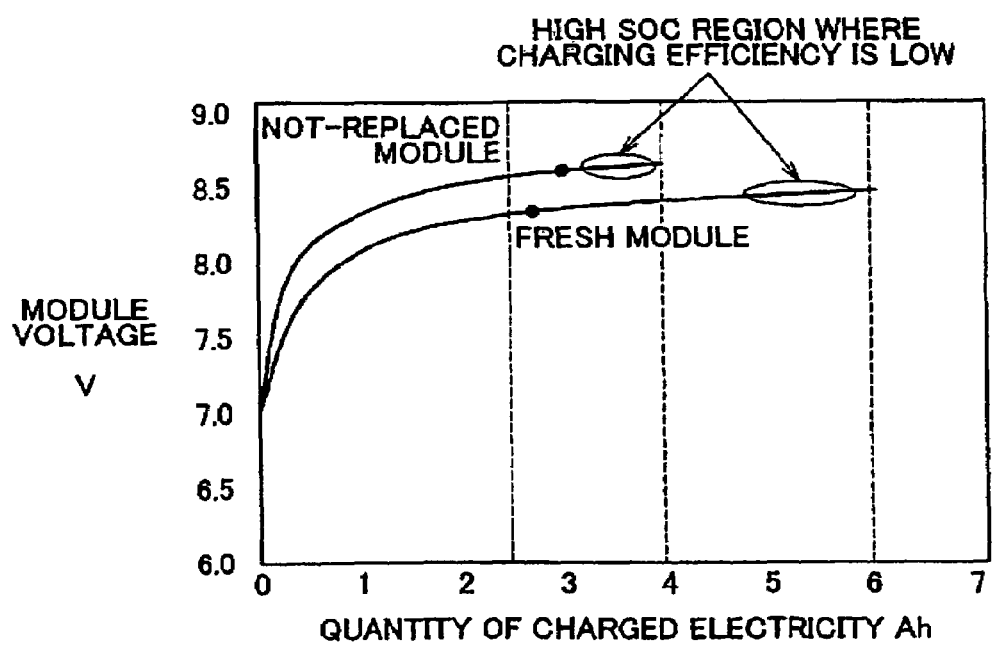
FIG. 4 is diagram (third diagram) indicating a relationship between the quantity of charged electricity and the module voltage.

The rebuilt battery assembly is subjected to a charge-discharge process corresponding to the not-replaced battery module whose performances have been substantially equalized. During this process, a battery ECU controls the charge-discharge state. As indicated in FIG. 4, a Ni-MH secondary battery has a region of low charging efficiency in a high SOC region. This will be explained below.

With reference to FIG. 5, chemical reactions that occur within a Ni-MH secondary battery will be described During the charging process in a normal reaction state, a reaction (1) mentioned below occurs on the positive electrode side, and a reaction (2) occurs on the negative electrode side. In the battery as a whole, a reaction (3) occurs. During the discharging process, the reactions occur in a reverse direction. In the following formula, "M" represents a hydrogen-storing alloy.

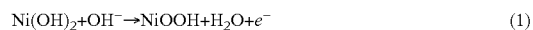

$$Ni(OH)_2 + OH^- \rightarrow NiOOH + H_2O + e^- \quad (1)$$

$$M + H_2O + e^- \rightarrow MH + OH^- \quad (2)$$

$$Ni(OH)_2 + M \rightarrow NiOOH + MH \quad (3)$$

During overcharge, a reaction (4) mentioned below occurs on the positive electrode side and reactions (5) and (6) occur on the negative electrode side, together with the aforementioned chemical reactions.

$$OH^- \rightarrow \tfrac{1}{2}H_2O + \tfrac{1}{4}O_2 \uparrow + e^- \quad (4)$$

$$M + H_2O + e^- \rightarrow MH + OH^- \quad (5)$$

$$MH_X \rightarrow M + X/2 H_2 \uparrow \quad (6)$$

The reactions during the overcharge (where SOC is higher than or equal to about 80%) partly occurs during the normal charging process as well. During the overcharging process, only the overcharge-time reactions occur.

If a main replay of the battery assembly is turned off while the overcharged state is maintained, recombination reactions occur. As for the recombination reactions, reactions expressed by formula (7) and (8) occur within the secondary battery.

$$MH_X + O_2 \rightarrow MH_{X-4} + 2H_2O \quad (7)$$

$$MH_X + H_2 \rightarrow MX_{X+2} \quad (8)$$

As can be understood from the formula (7) and (8), hydrogen stored in the hydrogen-storing alloy reduces oxygen gas, the hydrogen-storing alloy stores hydrogen due to the water repellency of the alloy, within the secondary battery. As for the recombination reactions, an exothermic reaction (9) occurs in the battery as a whole.

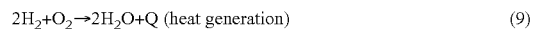

$$2H_2 + O_2 \rightarrow 2H_2O + Q \text{ (heat generation)} \quad (9)$$

This heat generation occurs in a region of SOC exceeding 80%. That is, a portion of the electric energy supplied to charge the secondary battery is not stored but is converted into heat energy. Therefore, the charging efficiency decreases. Therefore, normally, the charge-discharge region is set so as to avoid the region of SOC exceeding 80%.

This setting for avoiding the region of low charging efficiency is determined corresponding to a second battery (a not-replaced battery module) that has a low full-charged capacity. Through charge-discharge cycles with the aforementioned setting, the fresh secondary battery is not degraded, and the fresh battery module is free of memory effect. Therefore, the operating region of the fresh battery module gradually shifts to a high SOC region. Since due to the pre-replacement process in S110, the fresh battery module has a smaller quantity of charged electricity than the not-replaced battery modules at the beginning of the charge-discharge process, the aforementioned shift to the high SOC region relatively delays. Therefore, the charging efficiency does not become low, and maximum performance of the battery assembly as a whole can be delivered.

The fresh battery module, as the time of use increases, gradually degrades and acquires memory effect, so that the operating region thereof shifts to a low SOC region. That is, after repeated cycles of the charge-discharge process, the fresh battery module comes to have the same capacity as the other battery modules.

As indicated in FIG. 6A, the state of charge of a replacement (fresh) battery module in a battery assembly is 5 to 20% lower than the state of charge of the not-replaced battery modules at the time of the rebuilding of the battery assembly. Such a fresh battery module is incorporated as a battery module disposed at or near a central location in the battery where temperature is high. After a certain amount of time of running of the HEV with repeated charge-discharge cycles, the operating region of the fresh battery module shifts from the high SOC side during an initial period to the low SOC side due to the aging degradation and the memory effect, so that the capacities of the battery modules become appropriately equalized as indicated in FIG. 6B. If the state of charge of a replacement battery module is the same as the state of charge of the not-replaced battery modules (that is, the quantities of charged electricity of the modules are equal) at the time of incorporation into the battery assembly, the replacement battery module shifts more quickly to the high SOC region where the charging efficiency is low, so that appropriate equalization of the battery modules cannot be achieved.

Although, in the pre-replacement process in the embodiment, a replacement battery module to be incorporated is set at an quantity of charged electricity that is 5 to 20% lower than that of the not-replaced battery modules, the reference in this process may instead be SOC.

It to be understood that the above-disclosed embodiments are merely illustrative and not restrictive in every aspect. The scope of the invention is defined not by the foregoing description but by the appended claims, and is intended to cover all modifications and the like that are within the scope of the appended claims and equivalents thereof.

The invention claimed is:

1. A secondary battery replacement method for replacing a to-be-replaced secondary battery with a fresh secondary battery in a battery assembly formed by electrically connecting a plurality of secondary batteries in series or parallel, comprising the steps of:
   purposely charging the fresh secondary battery so that a quantity of charged electricity of the fresh secondary battery differs from a quantity of charged electricity of not-replaced batteries present in the battery assembly, wherein the quantity of charged electricity of the fresh secondary battery is 5 to 20% less than the quantity of any charged electricity of not-replaced batteries present in the battery assembly; and
   replacing the to-be-replaced secondary battery with the fresh secondary battery charged in the charging step.

2. The method according to claim 1, wherein the to-be-replaced secondary battery is a secondary battery having a reduced full-charged capacity or a secondary battery possessing a memory effect.

3. The method according to claim 1, wherein the replacing step includes the step of incorporating the charged fresh secondary battery into a portion of the battery assembly where temperature is high.

4. The method according to claim 1, wherein the secondary battery is a nickel-metal hydride battery.

5. A secondary battery replacement method comprising:
   selecting a secondary battery as a to-be-replaced secondary battery in a battery assembly formed by electrically connecting a plurality of secondary batteries in series or parallel;
   purposely charging the fresh secondary battery so that a quantity of charged electricity of the fresh secondary battery differs from a quantity of charged electricity of each not-replaced battery present in the battery assembly, wherein the quantity of charged electricity of the fresh secondary battery is 5 to 20% less than the quantity of charged electricity of any not-replaced battery present in the battery assembly; and
   replacing the to-be-replaced secondary battery with the fresh secondary battery charged in the charging step.

6. The method of claim 1, further comprising:
   inserting the fresh secondary battery in a location in the battery assembly where temperature becomes highest, wherein the location in the battery assembly where temperature becomes highest is the location a battery module farthest away from the cooling air flow.

7. The method of claim 5, further comprising:
   inserting the fresh secondary battery in a location in the battery assembly where temperature becomes highest, wherein the location in the battery assembly where temperature becomes highest is the location a battery module farthest away from the cooling air flow.

* * * * *